US006686668B2

United States Patent
Nesbit et al.

(10) Patent No.: US 6,686,668 B2
(45) Date of Patent: Feb. 3, 2004

(54) STRUCTURE AND METHOD OF FORMING BITLINE CONTACTS FOR A VERTICAL DRAM ARRAY USING A LINE BITLINE CONTACT MASK

(75) Inventors: Larry A. Nesbit, Williston, VT (US); Johnathan E. Faltermeier, Lagrange, NY (US); Ramachandra Divakaruni, Somers, NY (US); Wolfgang Bergner, Stormville, NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 196 days.

(21) Appl. No.: 09/764,833

(22) Filed: Jan. 17, 2001

(65) Prior Publication Data

US 2002/0093112 A1 Jul. 18, 2002

(51) Int. Cl.$^7$ ............................................. H01L 27/108
(52) U.S. Cl. ..................... 257/907; 257/300; 257/305; 257/309; 257/310; 257/311; 257/499; 257/501; 257/506; 257/776; 438/250; 438/253; 438/255
(58) Field of Search ................................. 257/907, 908, 257/300, 305, 309, 310, 311, 499, 501, 506, 776; 438/255, 250, 253

(56) References Cited

U.S. PATENT DOCUMENTS

| | | | | |
|---|---|---|---|---|
| 5,747,844 A | * | 5/1998 | Aoki et al. | 257/296 |
| 5,864,181 A | * | 1/1999 | Keeth | 257/776 |
| 6,091,100 A | * | 7/2000 | Wu | 257/315 |
| 6,310,399 B1 | * | 10/2001 | Feurle et al. | 257/776 |

* cited by examiner

Primary Examiner—Eddie Lee
Assistant Examiner—Edgardo Ortiz
(74) Attorney, Agent, or Firm—Whitham, Curtis & Christofferson, P.C.; Joseph P. Abate (57) ABSTRACT

A bitline contact and method of forming bitline contact for a vertical DRAM array using a bitline contact mask. In the method, gate conductor lines are formed. An oxide layer is deposited over the gate conductor lines, and a bitline contact mask is formed over portions of the oxide layer. The bitline contact mask is etched, and a silicon layer is deposited on the substrate. A bitline layer is deposited on the silicon layer. A masking and etching operation is performed on the bitline layer. A M0 metal is deposited over the silicon layer and on sides of non etched portions of the bitline (M0) layer to form left and right bitlines.

5 Claims, 7 Drawing Sheets

STRUCTURE AND METHOD OF FORMING BITLINE CONTACTS FOR A VERTICAL DRAM ARRAY USING A LINE BITLINE CONTACT MASK

BACKGROUND OF THE INVENTION

1. Field of the Invention

The present invention generally relates to a process of forming a bitline contact and, more particularly, to a method of forming bitline contacts for a vertical dram array using a bitline contact mask and a structure thereof.

2. Background Description

Random Access Memory (RAM) is a type of volatile memory which is typically used for temporary storage of program data in a computer system. There are several types of RAM, including Static RAM (SRAM) and Dynamic RAM (DRAM). In SRAM, data does not need to be periodically rewritten, and is maintained as long as power is provided to the memory chip. On the other hand, DRAM must be continually rewritten in order for it to maintain the data. DRAM is small and inexpensive and is thus used for most system memory.

A DRAM memory array includes a table of cells which are comprised of capacitors. These capacitors contain one or more "bits" of data, depending upon the chip configuration. The table of cells is addressed via row and column decoders which receive signals from clock generators. In order to minimize the package size, the row and column addresses are multiplexed into row and column address buffers. Access transistors called "sense amps" are connected to each column and provide the read and restore operations of the DRAM memory array. Since the cells are capacitors that discharge for each read operation, the sense amp must restore the data before the end of the access cycle. It is known that separate address, data and control lines limit the access speed of the device.

Formation of the control lines of the DRAM array is of critical importance to the operational speed and robustness of the DRAM array. In current processing techniques, borderless bitline contacts are formed by means of a contact/hole mask. Current DRAM cell sizes are of the order of $8F^2$. For cell sizes below $8F^2$, it has been proposed to vertically twist the bitlines between two bitline levels. In general, this technique causes a loss in area in the DRAM array. This, in turn, limits the density of the columns and rows of bitlines, as well as causing different potentials of the bitlines. Performance and robustness of the DRAM device may thus be compromised using these techniques.

SUMMARY OF THE INVENTION

The present invention is directed to a process of forming a bitline contact and, more particularly, to a method of forming line bitline contacts for a vertical DRAM array using a bitline contact mask. The method of the present invention allows vertical bitline twisting without loss of area in the DRAM array.

In one aspect of the present invention, gate conductor lines with a capping layer are formed on a substrate. An oxide layer is deposited on the capping layer and between the gate conductor lines. A line bitline mask is formed over portions of the oxide layer. The mask is a line mask which is easier to print than a contact/hole mask. The mask is used to etch the oxide layer to the capping layer of the gate conductor lines, and to etch the oxide layer between the gate conductor lines down to the substrate. A silicon layer is deposited on the substrate and between gate conductor lines and non etched portions of the oxide layer. This silicon layer is removed from the top planar or non-etched portions of the oxide by means of a planarizing technique such as Chemical Mechanical Polishing (CMP). A bitline (M0) TEOS layer is deposited on the silicon layer and non etched portions of the oxide layer, and a masking and etching operation of portions of the bitline (M0) TEOS layer are performed. M0 metal is deposited over the silicon layer and on sides of non etched portions of the bitline (M0) layer to form left and right bitlines.

In another aspect of the present invention, a bitline contact for a vertical DRAM array is provided. The bitline contacts include gate conductor lines formed on a substrate. A polysilicon layer is formed between the gate conductor lines, and an oxide layer is formed over at least one of the gate conductor lines. Metal is formed over the gate conductor lines on opposing sides of the oxide layer thereby forming a left bitline and a right bitline. The left and right bitlines are vertically non-twisted.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention is directed to a method of forming a bitline contact using a line bitline mask. The bitline contact(s) formed using the method of the present invention is preferably designed and used in a DRAM cell and more particularly in a vertical DRAM array. The bitline contact(s) of the present invention is even more preferably implemented in a DRAM cell in which there is one borderless bitline contact per cell.

In the embodiments of the present invention, the bitline contacts are arranged in a row/column separated by perpendicular wordlines or gate conductor lines. By using the method of the present invention, it is possible to form the bitline contact (defined by a bitline mask) in one direction and defined by gate conductor lines in a perpendicular direction. In the formation of the bitline contact, the bitline contact material is formed below a top of the gate conductor lines and the gate conductor lines are entirely encapsulated by insulating material. It should be well understood by those of ordinary skill in the art that the insulating material prevents electrical contact between the gate conductor and the bitline contact material. It is also noted that by using the method of the present invention, the desired area for the formation of the bitline contact is the under the bitline contact line and between the gate conductor lines. In this manner, the present invention allows for vertical bitline twisting without loss of area in the DRAM array.

Method of Formation of the Present Invention

Figure 1A:
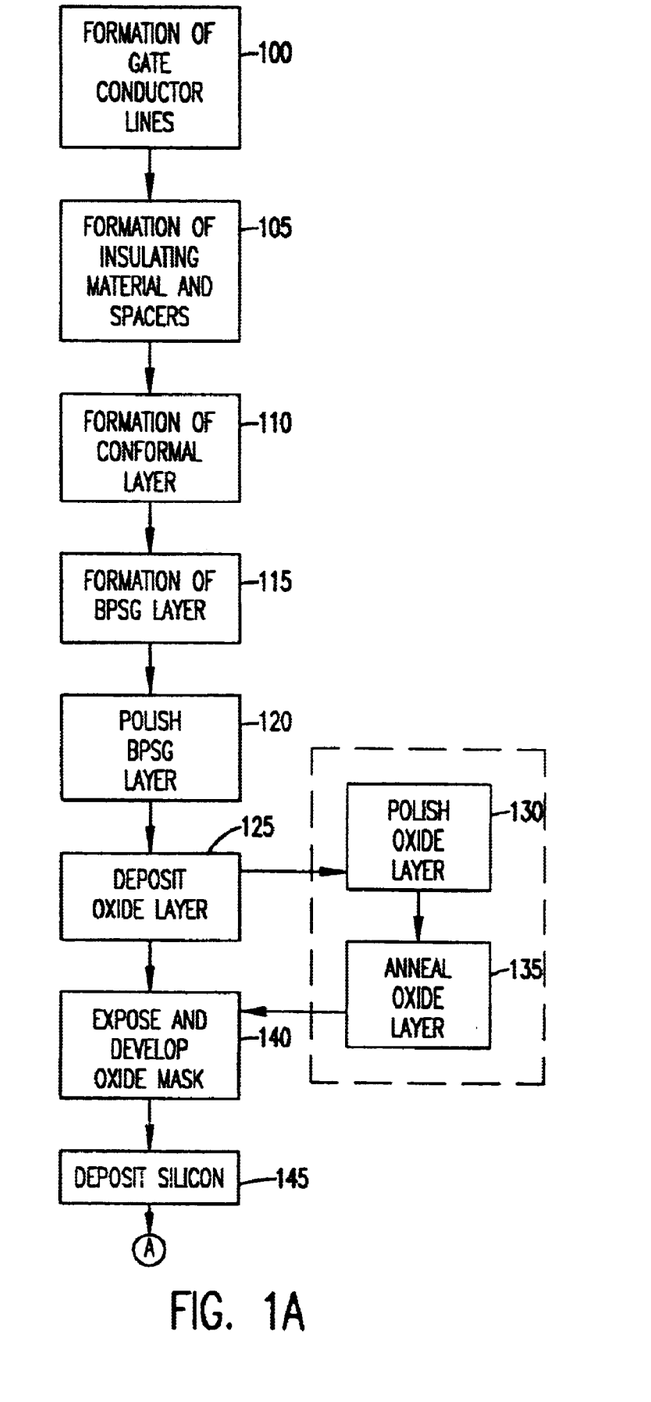
FIGS. 1a–1b show an exemplary flow diagram of a process for forming a bitline contact of the present invention.
Figure 1B:
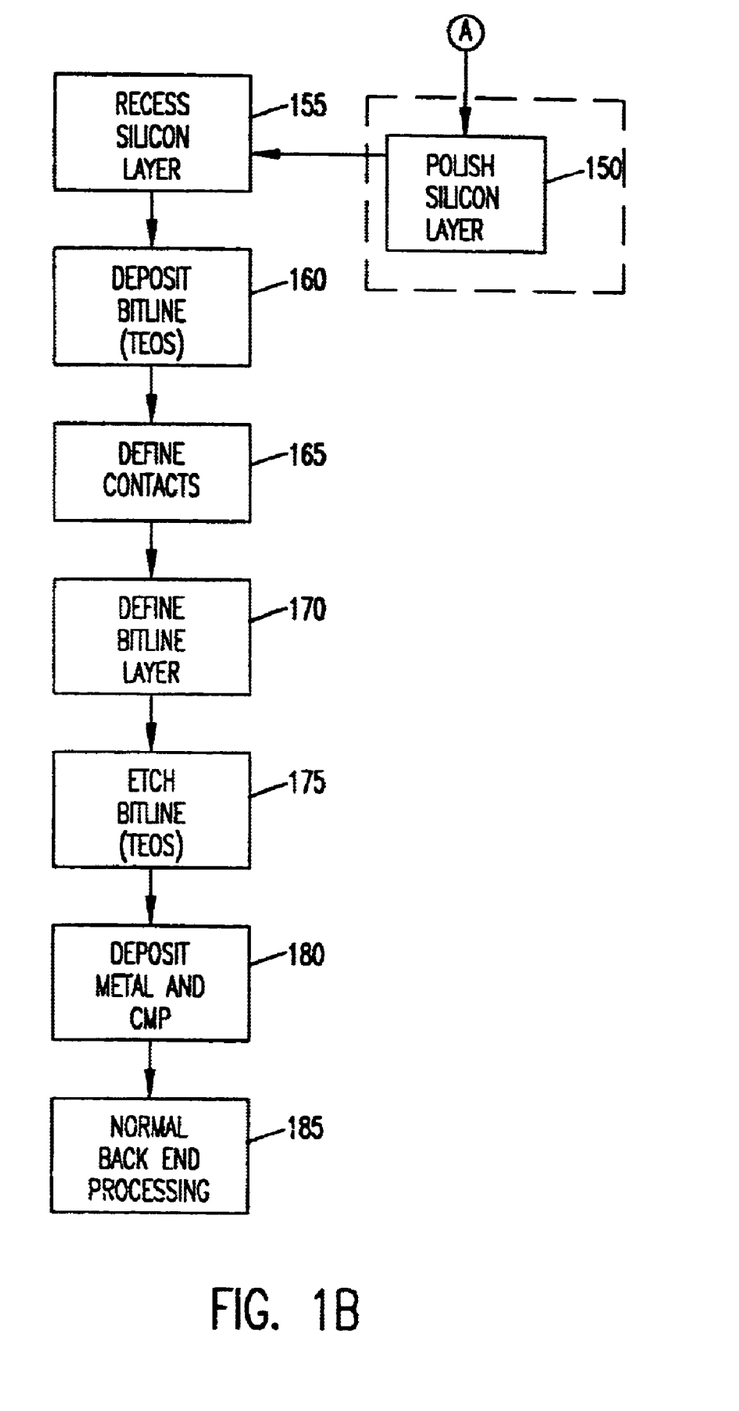

Referring now to the drawings, and more particularly to FIGS. 1a–1b, there is shown a flow diagram of one exemplary embodiment of a fabrication process in accordance with the present invention. The fabrication process shown in FIGS. 1a–1b describes several embodiments, none of which are necessarily required in any one preferred embodiment but which still make part of the present invention.

Specifically and now referencing to FIGS. 1a–1b, in process step 100, gate conductor lines with a capping silicon nitride material are formed on a silicon substrate. The gate conductor lines are preferably defined by conventional lithographic and etching techniques. In process step 105, insulating materials are formed along the sidewalls of the gate conductor lines. These insulating materials may include, but are not limited to, an oxidation as well as silicon nitride. The silicon nitride may be used for the formation of silicon nitride spacers, as may be formed using reactive ion etching (RIE) techniques.

In process step 110, a conformal silicon nitride layer is deposited on the defined gate conductor lines. The conformal nitride layer may also be formed over the active area and the isolation areas between the active areas. In process step 115, a layer of BoroPhosphoSilicate Glass (BPSG) is deposited and annealed over the thus formed structure. The annealing process is provided in order to eliminate any voids in the BPSG between the gate conductor lines. The resulting BPSG thickness is above the level of the formed gate conductor lines. In process step 120, the BPSG is polished back to the tops of the gate conductor lines, and even more preferably below the tops thereof. The polishing of the BPSG is preferably performed by Chemical Mechanical Polishing (CMP).

In process step 125, a TEOS (tetraethylorthosilane) layer or other suitable oxide is deposited on the BPSG using plasma enhanced chemical vapor deposition (PECVD). The thickness of this TEOS layer will depend on whether the TEOS oxide is planarized. As an optional step, in process step 130, the TEOS oxide layer may be polished (e.g., planarized). In this embodiment, the polishing would be a "blind" polishing without a polish stop. In this polishing step, the final TEOS layer thickness above the gate conductor lines would be approximately 30–100 nm. In further embodiments, the TEOS oxide layer is optionally densified via a Rapid Thermal Anneal (RTA) (process step 135). A typical RTA may be performed at approximately 900–1000° C. for 5–30 seconds in either Ar or $N_2$.

In process step 140, a bitline contact mask with conventional Anti-Reflective Coating (ARC) is exposed and developed. The development of the bitline contact mask includes selectively etching the TEOS oxide and BPSG to the nitride layer cap and the nitride spacer and stopping on the Si substrate. In process step 145, low pressure chemical vapor deposition (LPCVD) n+ amorphous/polycrystalline silicon is deposited over the gate conductor lines. In one preferred embodiment, a prior pre-clean step is performed to remove any residual oxide from the contact hole. In process step 150, an optional step of CMP is provided on the n+ amorphous/polycrystalline silicon to the TEOS layer (i.e., gate conductor line).

In process step 155, an isotropic dry etch to recess the n+ amorphous/polycrystalline silicon to below the level of the capping nitride layer is performed. In this process step, the silicon is etched selective to the capping nitride layer. In this manner there is minimal etching of the capping nitride layer. This step isolates the polysilicon stud between the gates from adjacent studs.

In process step 160, a bitline (M0) TEOS layer is deposited on the thus formed structure. It may be necessary to perform CMP on the bitline (M0) TEOS layer in order to planarize such layer. It may also be necessary, in embodiments, to anneal the bitline (M0) TEOS layer. This latter process step will densify the bitline (M0) TEOS layer.

In process step 165, contacts to support junctions and gates are defined and, in process step 170, a damascene bitline metal level (M0) is defined using conventional lithography. The M0 TEOS is then etched to the n+ amorphous/polycrystalline silicon selective to the nitride layer encapsulating the gate conductor lines in process step 175.

In process step 180, M0 metal (preferably tungsten) is deposited, and CMP is performed to polish the back the M0 metal layer to the TEOS oxide layer. A touch-up polishing may be required to minimize or eliminate any residual M0 metal. In process step 185, normal back end processing is continued.

By using the method of the present invention, the bitline contact mask is printed as a line instead of a series of contact holes. This makes it easier to determine the image compensation numbers for mask fabrication. It should also be understood by using such a process it is thus easier to fabricate the mask, itself, as well as print the images in the resist. Additionally, it is easier to etch the oxide selective to the gate conductor capping nitride layer and to characterize the resulting etched structure.

Device Structure of the Present Invention

Figure 9:
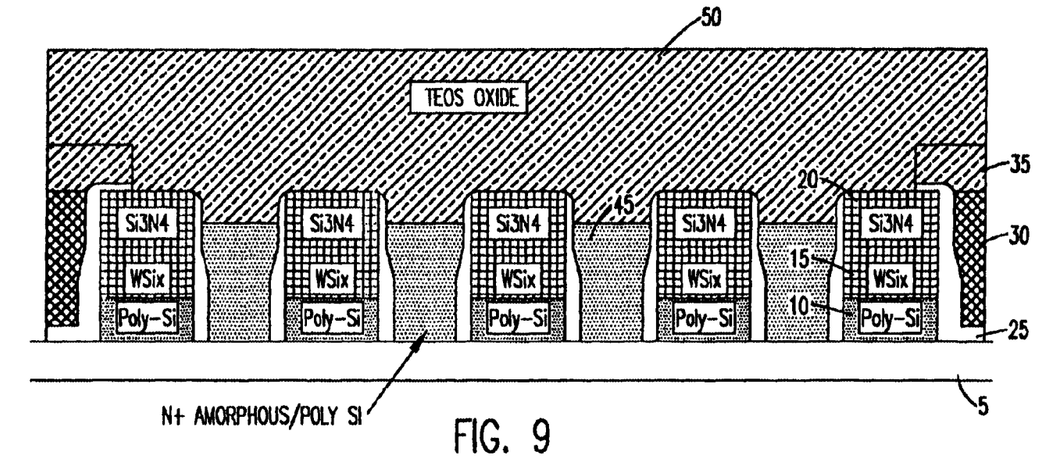
Figure 10:
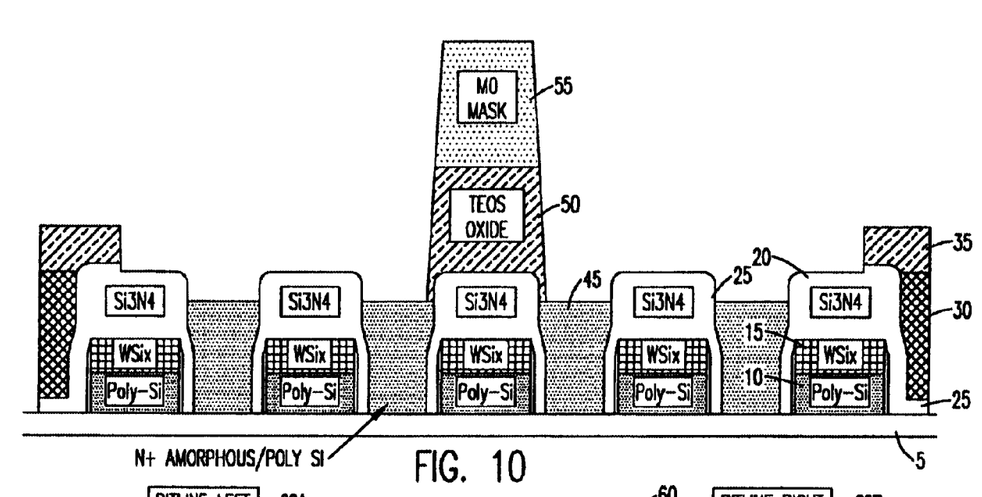
Figure 11:
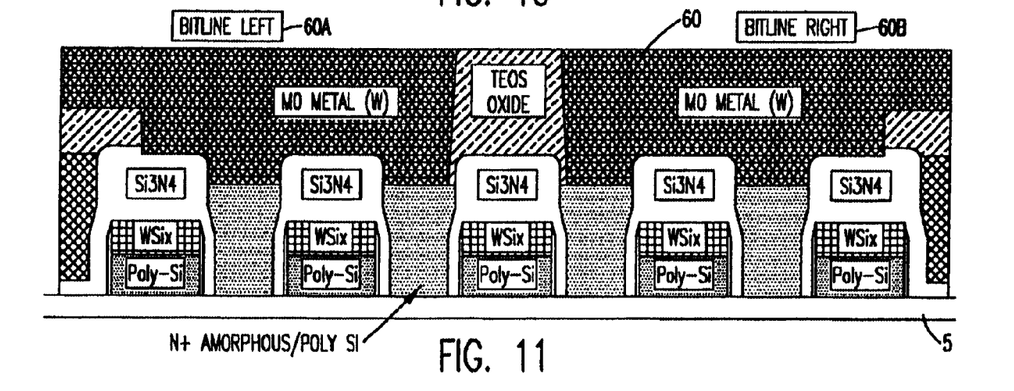
FIG. 11 shows the bitline contact for use with a vertical DRAM array of the present invention.

Referring now to FIGS. 2–11, the corresponding cross-sections of selected steps from the process flow diagram of FIGS. 1a–1b are now described. FIG. 11 shows the final structure of the present invention.

Figure 2:
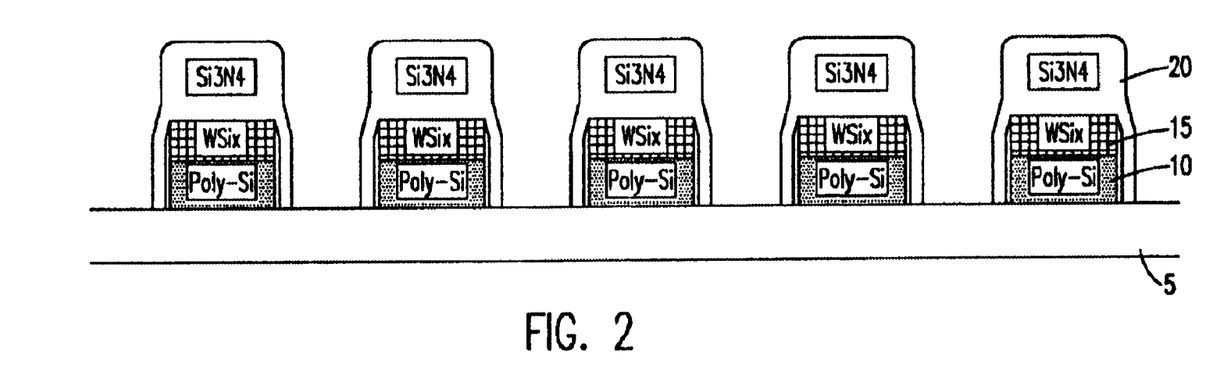
FIGS. 2–10 show the several stages of formation of the bitline contact for a vertical DRAM array in accordance with the steps of FIGS. 1a–1b.

FIG. 2 shows a substrate 5 (preferably silicon) having gate conductor lines with a capping silicon nitride material formed thereon. Specifically, the gate conductor includes a polysilicon layer 10 formed over a Si substrate 5. A $WSi_x$ (or W/WN) layer 15 is formed over the polysilicon layer 10, and preferably a $Si_3N_4$ insulating layer 20 is formed over the $WSi_x$ layer 15 and the sidewalls of both the polysilicon layer 10 and the $WSi_x$ layer 15. The insulating material may also be an oxidation as well as silicon nitride. The polysilicon and silicide layers are preferably 150 nm, but may be in the range from approximately 30–300 nm in thickness. Also, the capping layer may be approximately in the range of 50–300 nm and preferably 150 nm in thickness. The sidewall oxidation is preferably 5 nm but may range between approximately 1–10 nm in thickness.

Figure 3:
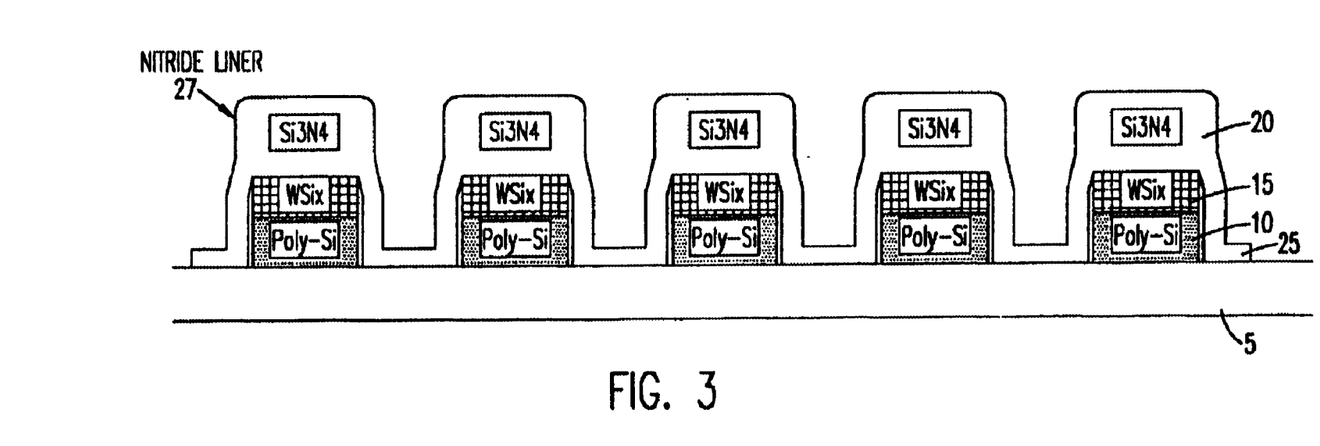

FIG. 3 shows the formation of spacers 25 between the gate conductor lines. The spacers are preferably silicon nitride spacers. The silicon nitride may also form a nitride liner or cap 27. The spacer is preferably 30 nm in thickness but may range from approximately 10–100 nm in thickness.

Figure 4:
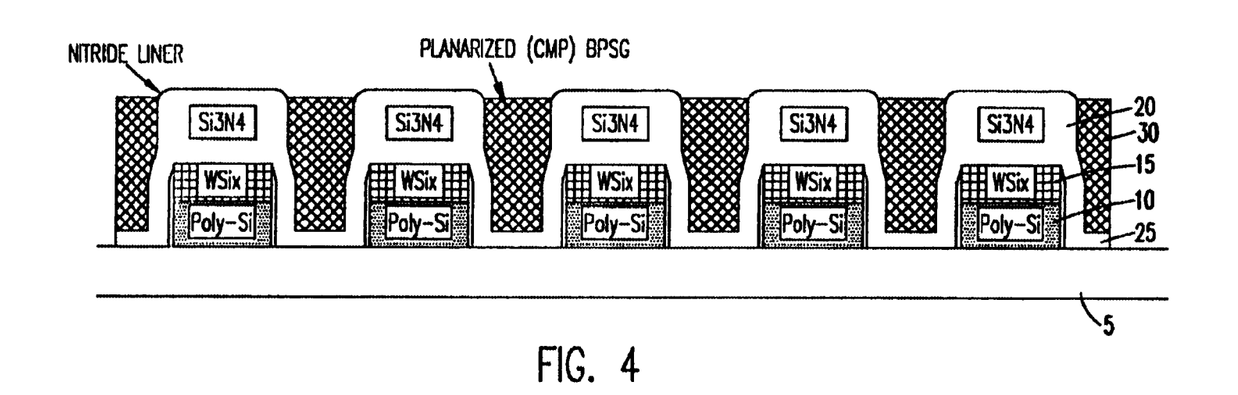

FIG. 4 shows a layer of BoroPhosphoSilicate Glass (BPSG) 30 deposited and annealed over the thus formed structure. The resulting BPSG thickness is above the level of the formed gate conductor lines, but is polished back to the tops of the gate conductor lines, and preferably below the tops thereof. The BPSG layer is preferably 300 nm in thickness but may range from approximately 100–800 nm in thickness.

Figure 5:
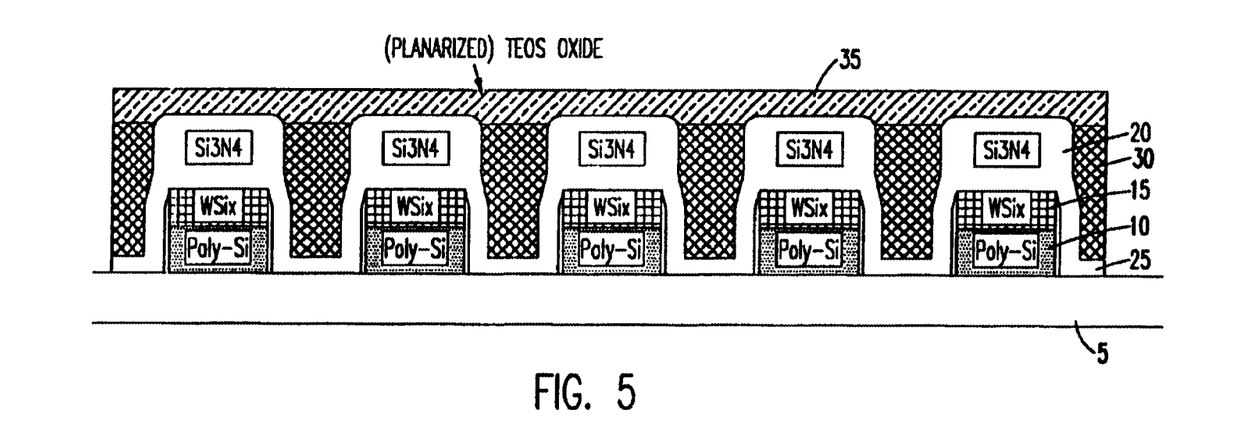

FIG. 5 shows TEOS layer 35 or other suitable oxide deposited on the BPSG layer 30. The TEOS layer is preferably 50 nm in thickness. In FIG. 5, the TEOS layer 35 is planarized, which is an optional step. In this embodiment, the polishing would be a "blind" polishing and the final TEOS layer thickness would be above he gate conductor lines. The thickness of the TEOS layer 35 may be in the range of approximately 30–100 nm.

Figure 6:
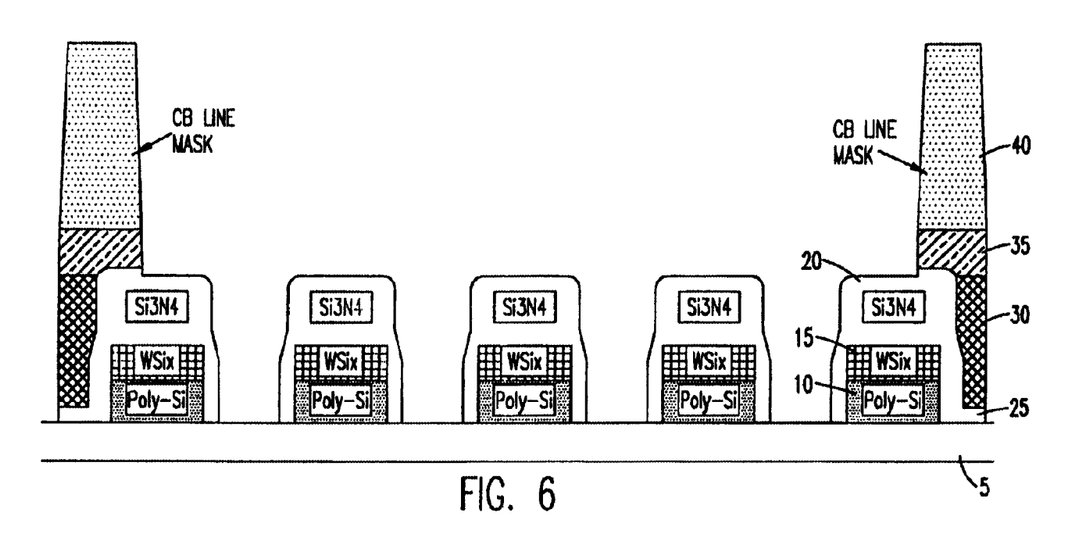

FIG. 6 shows the formation and development of the bitline contact mask 40. The development of the bitline contact mask 40 is a line mask and includes selectively etching the TEOS oxide layer 35 and the BPSG layer 30 to the nitride layer cap 27 and the nitride spacer 25. The etching process stops at the Si substrate 5.

Figure 7:
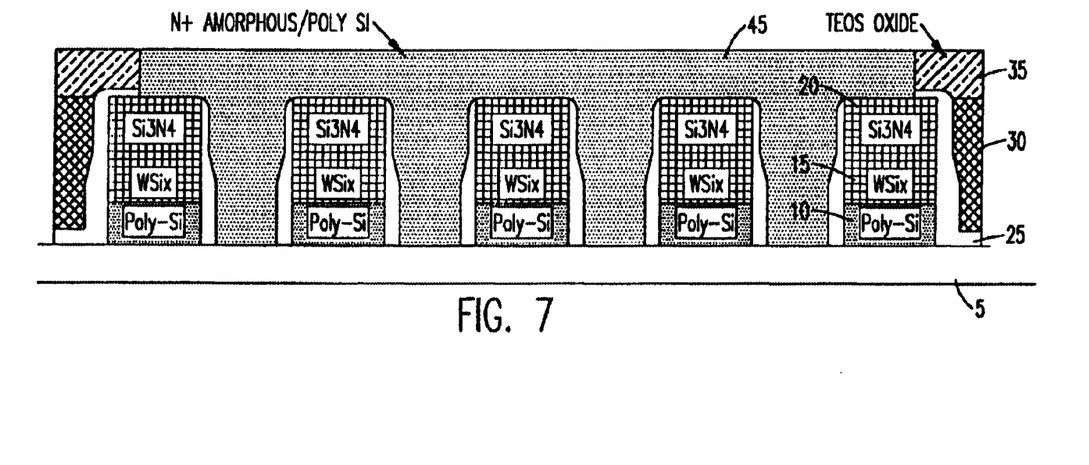
Figure 8:
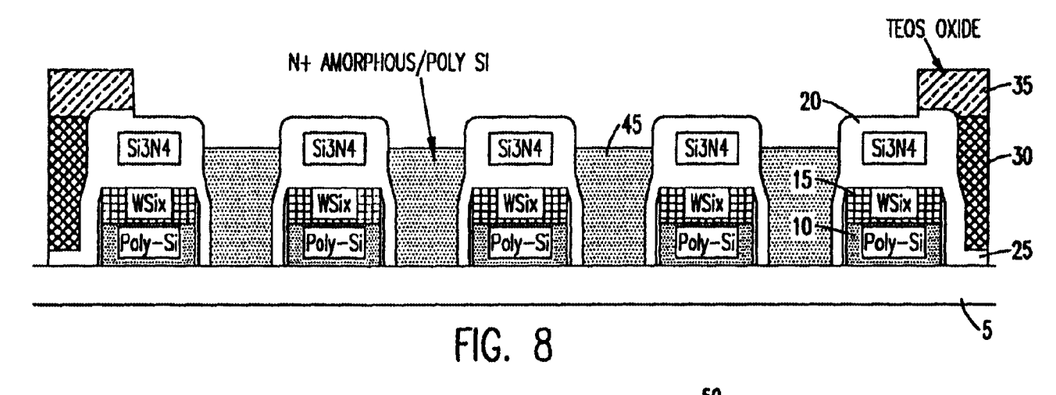

In FIG. 7, a low pressure chemical vapor deposition (LPCVD) n+ amorphous/polycrystalline silicon layer 45 is deposited. The n+ amorphous/polycrystalline silicon layer 45 is etched to the TEOS oxide layer 35, and is preferably 100 nm (but may be in the range of approximately 30–500 nm). FIG. 8 shows the n+ amorphous/polycrystalline silicon layer 45 etched to below the capping nitride layer 27.

FIG. 9 shows a bitline (M0) TEOS layer 50 deposited on the thus etched amorphous/polycrystalline silicon layer 45. This layer is preferably 300 nm in thickness but may range from 100 nm to 800 nm. FIG. 10 shows a damascene bitline metal level (M0) 55 defined using conventional lithography. The damascene bitline metal level (M0) 55 and the TEOS oxide layer 50 are etched to the n+ amorphous/polycrystalline silicon layer 45, selective to the nitride layer encapsulating the gate conductor lines.

FIG. 11 shows the final structure of the present invention. In particular the M0 metal layer 60 is deposited over the conductor lines and TEOS oxide layer 50. The M0 metal layer 60 is preferably 300 nm in thickness but may be in the range of approximately 100–500 nm. As shown in FIG. 11, the M0 metal layer 60 is then etched back or polished by CMP to the TEOS oxide layer 50 to form a bitline left 60a and a bitline right 60b. Conventional back end processing is then performed.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. In an integrated circuit including a memory array having dielectric encapsulated gate conductor lines formed on a substrate and bit lines extending transverse thereto, wherein a bitline thereof has a bitline contact, said bitline contact comprising:

a polysilicon layer formed in contact with said substrate extending transverse to and linearly between three or more adjacent said gate conductor lines; and a linearly extending metal layer formed over and in contact with said polysilicon layer.

2. The bitline contact of claim 1 wherein said linearly extending metal layer contacts the dielectric encapsulation of said dielectric encapsulated gate conductor lines.

3. The bitline contact of claim 1, wherein the polysilicon layer is an N+ amorphous/polycrystalline silicon layer.

4. The bitline contact of claim 1, further comprising spacers between two adjacent gate conductor lines of the gate conductor lines.

5. The bitline contact of claim 4, further comprising a layer of BoroPhosphoSilicate Glass (BPSG) and a topping oxide layer formed over the spacers.

* * * * *